United States Patent [19]
Holst

[11] Patent Number: 5,299,147
[45] Date of Patent: Mar. 29, 1994

[54] DECODER SCHEME FOR FULLY ASSOCIATIVE TRANSLATION-LOOKASIDE BUFFER

[75] Inventor: John C. Holst, San Jose, Calif.

[73] Assignee: Intergraph Corporation, Huntsville, Ala.

[21] Appl. No.: 23,783

[22] Filed: Feb. 22, 1993

[51] Int. Cl.$^5$ ...................... G11C 15/00; G11C 13/00
[52] U.S. Cl. .................................. 365/49; 365/189.01; 365/189.04; 365/189.07; 365/230.08
[58] Field of Search ................ 365/49, 189.01, 189.04, 365/189.05, 189.07, 230.08

[56] References Cited

U.S. PATENT DOCUMENTS

4,646,271  2/1987  Uchiyama ............................ 365/49

Primary Examiner—Terrell W. Fears

[57] ABSTRACT

A fully associative translation lookaside buffer (TLB) using a content addressable memory (CAM) array to store virtual addresses and a static random access memory (SRAM) array to store corresponding physical addresses. The TLB incorporates a logic circuit that allows the SRAM to be accessed during both associative and non-associative modes by word lines that are strictly a function of corresponding match lines. Additionally, the logic circuit incorporated in the TLB does not introduce any additional delay in outputting the physical address from the SRAM during the associative mode.

20 Claims, 6 Drawing Sheets

DECODER SCHEME FOR FULLY ASSOCIATIVE TRANSLATION-LOOKASIDE BUFFER

The present invention relates generally to a translation lookaside buffer. More specifically, the present invention relates to a fully associative translation lookaside buffer in a memory system that implements both a non-associative read/write mode and an associative access mode.

BACKGROUND OF THE INVENTION

Most modern computers use a virtual addressing scheme which allows the computer to address an address space that is larger than the computer's internal memory. In such a scheme, a virtual address must be translated to a physical address before the memory can be accessed. Unfortunately, each translation process ordinarily requires multiple accesses to page and segment tables in the computer's memory, which significantly degrades the computer's performance.

To overcome this problem, a translation lookaside buffer (TLB) is often used to maintain the most recently used virtual address and physical address mappings. Each TLB entry ordinarily contains a virtual address, a real address mapped to the virtual address, and sometimes, control information such as access protection flags, etc. Before translating an input virtual address in the conventional manner, the TLB is searched to see if a physical address mapping for the virtual address is present. If a physical address mapping is present in the TLB, the physical address may be obtained directly from the TLB, and the conventional time-wasting translation process is avoided.

Figure 1:
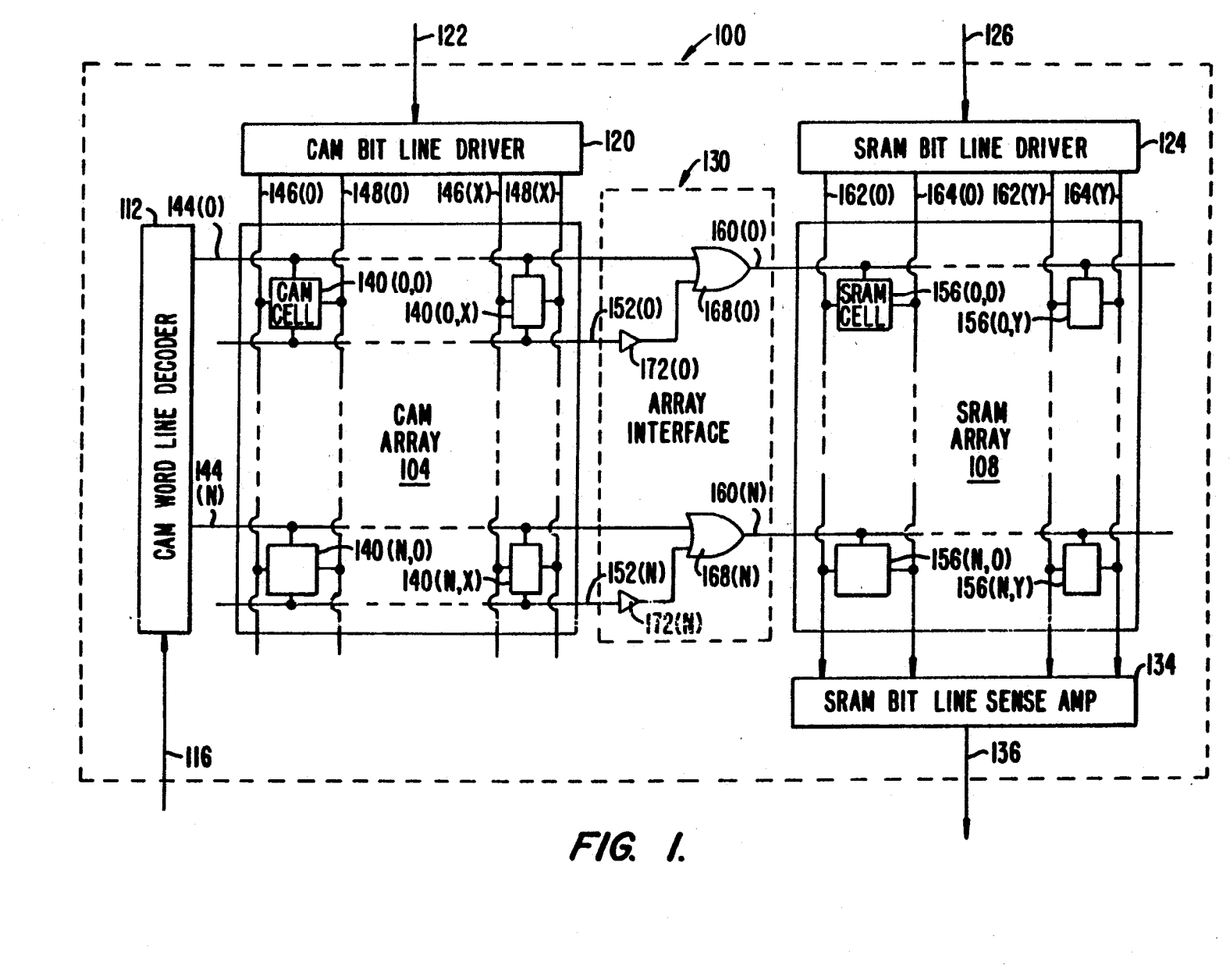
FIG. 1 is a block diagram of a prior art translation lookaside buffer that uses an ORing decoding scheme to support non-associative and associative access modes.

FIG. 1 is a block diagram of a known TLB 100 which stores a set of virtual address/physical address translations. TLB 100 comprises a content addressable memory (CAM) array 104 for storing a plurality of virtual addresses, a static random-access memory (SRAM) array 108 for storing a plurality of physical addresses corresponding to the virtual addresses stored in CAM array 104, a CAM word line decoder 112 for receiving a line address from the CPU over a communication path 116, a CAM bit line driver 120 for receiving a virtual address from the CPU over a communication path 122, an SRAM bit line driver 124 for receiving a physical address from the CPU over a communication path 126, an array interface 130 for accessing SRAM array 108 in response to signals from CAM array 104 and from CAM word line decoder 112, and an SRAM bit line sense amplifier 134 for providing a physical address stored in SRAM array 108 to the CPU over a communication path 136.

CAM array 104 comprises a plurality of CAM cells 140(0,0) ... 140(N,X) arranged in N rows and X columns. Each row of CAM cells 140(0,0-X) ... 140(N,0-X) stores a single X-bit virtual address and is coupled to one of a plurality of CAM word lines 144(0) ... 144(N) from CAM word line decoder 112. Each column of CAM cells 140(0-N,0) ... 140(0-N,X) is coupled to a corresponding pair of a plurality of differential CAM bit lines 146(0) ... 146(X), 148(0) ... 148(X) from CAM bit line driver 120. CAM word lines 144(0) ... 144(N) and CAM bit lines 146(0) ... 146(X), 148(0) ... 148(X) activate the CAM cells 140(0,0) ... 140(N,X) to which they are attached. Each row of CAM cells 140(0,0-X) ... 140(N,0-X) is also connected to one of a plurality of match lines 152(0) ... 152(N) for indicating which row of CAM cells 140(0,0-X) ... 140(N,0-X) stores the virtual address which matches the virtual address input to CAM bit line driver 120

Similarly, SRAM array 108 comprises a plurality of SRAM cells 156(0,0) ... 156(N,Y) arranged in N rows and Y columns. Each row of SRAM cells 156(0,0-Y) ... 156(N,0-Y) stores a single Y-bit physical address and is coupled to one of a plurality of SRAM word lines 160(0) ... 160(N) from array interface 130. Each column of SRAM cells 156(0-N,0) ... 156(0-N,Y) is coupled to a corresponding pair of a plurality of differential SRAM bit lines 162(0) ... 162(Y), 164(0) ... 164(Y) from SRAM bit line driver 124. SRAM word lines 160(0) ... 160(N) and SRAM bit lines 162(0) ... 162(Y), 164(0) ... 164(Y) activate the SRAM cells 156(0,0) ... 156(N, Y) to which they are attached. SRAM bit lines 162(0) ... 162(Y), 164(0) ... 164(Y) are also coupled to SRAM bit line sense amplifier 134 for providing the contents of the selected row of SRAM cells to the CPU.

Array interface 130 comprises a plurality of OR gates 168(0) ... 168(N). Each OR gate 168(0) ... 168(N) has a first input terminal coupled to a corresponding one of CAM word lines 144(0) ... 144(N), a second input terminal coupled to a corresponding one of match lines 152(0) ... 152(N) through corresponding sense amplifiers 172(0) ... 172(N), and an output terminal coupled to a corresponding one of SRAM word lines 160(0) ... 160(N). Array interface 130 selects one of the rows of SRAM cells 156(0,0-Y) ... 156(N,0-Y) in response to CAM word lines 144(0) ... 144(N) during a non-associative mode of operation (discussed below), and array interface 130 selects one of the rows of SRAM cells 156(0,0-Y) ... 156(N,0-Y) in response to match lines 152(0) ... 152(N) during an associative mode of operation.

The non-associative mode of operation includes either a write access or a read access. During a non-associative write access, a virtual address from the CPU is provided to CAM bit line driver 120 over communication path 122, a physical address from the CPU is provided to SRAM bit line driver 124 over communication path 126, and a write address is supplied from the CPU to CAM word line decoder 112 over communication path 116. CAM word line decoder 112 decodes the address received over communication path 116 and generates a high signal on a single CAM word line 144(I) from the plurality of CAM word lines 144(0) ... 144(N) for activating CAM cells 140(I,0-X). The high signal on CAM word line 144(I) also causes the corresponding OR gate 168(I) in array interface 130 to generate a high signal on SRAM word line 160(I) for activating SRAM cells 156(I,0-Y). The virtual and physical addresses then may be written into CAM array 104 and SRAM array 108 at locations defined by the activated CAM cells 140(I,0-X) and SRAM cells 156(I,0-Y), respectively.

A non-associative read access operates the same way, except addresses are not supplied to CAM bit line driver 120 or SRAM bit line driver 124. The addressed physical address is output from SRAM bit line sense amp 134 over communication path 136.

During the associative mode of operation, a virtual address is input to CAM bit line driver 120, and the input virtual address is simultaneously compared with all virtual addresses stored in CAM array 104. If the input virtual addresses matches a virtual address stored in CAM array 104 (e.g., in CAM cells 140(I,0-X)), then a high signal is generated on the appropriate match line (e.g., match line 152(I)). The high signal is detected by sense amp 172(I), which in turn causes a high signal to be generated by OR gate 168(I). The high signal from OR gate 168(I) activates SRAM cells 156(I,0-Y) for communicating the stored physical address to SRAM bit line sense amp 134 and thereafter to the CPU over communication path 136.

A TLB implemented in this manner has the primary drawback of requiring extra time to output a physical address from SRAM array 108 during an associative access because array interface 130 includes OR gates 168(0) . . . 168(N) having match lines 152(0) . . . 152(N) and CAM word lines 144(0) . . . 144(N) as inputs. During an associative access, signals on match lines 152(0) . . . 152(N) which indicate if a match has been found on a match line 152(I) must propagate through OR gates 168(0) . . . 168(N) before the physical address stored in SRAM array 108 is output to the CPU.

The time it takes for TLB 100 to output a physical address once a matching virtual address has been found is of critical importance. The path a signal on match line 152(I) travels from the point a match is found until the physical address is output from SRAM 108 is commonly referred to as the "critical path." OR gates 168(0) . . . 168(N) are situated in the critical path so that they add an undesirable delay to associative accesses and reduce the performance of TLB 100.

Figure 2:
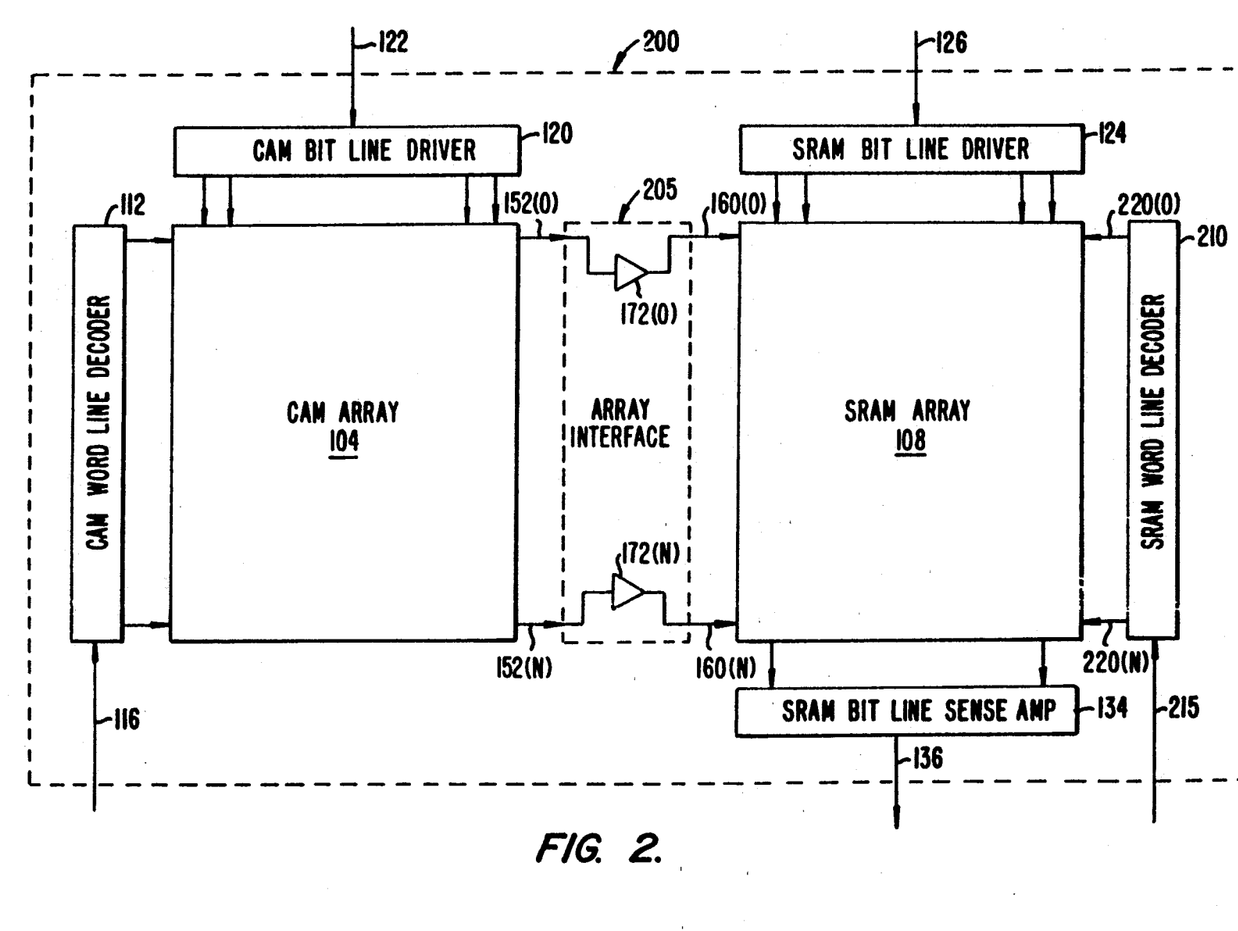
FIG. 2 is a block diagram of a prior art translation lookaside buffer that uses two word line decoders to support non-associative and associative access modes.

FIG. 2 is a block diagram of a known TLB 200 which attempts to overcome the primary disadvantage of TLB 100 in that there is no additional delay in outputting a physical address from TLB 200 during the associative access mode. The TLB illustrated in FIG. 2 is discussed in "A 4-ns BiCMOS Translation-Lookaside Buffer" in IEEE Journal of Solid-State Circuits, Vol. 25, No. 5. For convenience of describing the operation of TLB 200, the same reference numerals used in FIG. 1 are used in FIG. 2 to refer to identical elements. Furthermore, the operation of TLB 200 is identical to the operation of TLB 100 except in the manner in which SRAM array 108 is accessed during both associative and non-associative modes.

TLB 200 comprises the same components as TLB 100 except that an array interface 205 replaces array interface 130. Additionally, TLB 200 comprises an SRAM word line decoder 210 for receiving a line address from the CPU over a communication path 215 and for accessing the rows of SRAM cells with output lines 220(0) . . . 220(N) which are coupled to rows of SRAM cells 156(0,0-Y) . . . 156(N,0-Y).

Array interface 205 comprises a plurality of sense amplifiers 172(0) . . . 172(N). Each sense amplifier 172(0) . . . 172(N) has an input terminal coupled to a corresponding one of match lines 152(0) . . . 152(N) and an output terminal coupled to a corresponding one of SRAM word lines 160(0) . . . 160(N). Array interface 205 selects one of the rows of SRAM cells 156(0,0-Y) . . . 156(N,0-Y) in response to match lines 152(0) . . . 152(N) during the associative mode.

During a non-associative write access, a virtual address from the CPU is provided to CAM bit line driver 120 over communication path 122, a physical address from the CPU is provided to SRAM bit line driver 124 over communication path 126, and a write address is supplied from the CPU to CAM word line decoder 112 over communication path 116 and to SRAM word line decoder 210 over communication path 215. CAM word line decoder 112 decodes the write address received over communication path 116 and generates a high signal on a single CAM word line 144(I) from the plurality of CAM word lines 144(0) . . . 144(N) for activating CAM cells 140(I,0-X). SRAM word line decoder 210 decodes the write address received over communication path 215 and generates a high signal on a output line 220(I) from the plurality of output lines 220(0) . . . 220(N). Output line 220(I) then activates SRAM cells 156(I,0-Y). The virtual and physical addresses then may be written into CAM array 104 and SRAM array 108 at locations defined by the activated CAM cells 140(I,0-X) and SRAM cells 156(I,0-Y), respectively.

A non-associative read access operates the same way, except addresses are not supplied to CAM bit line driver 120 or SRAM bit line driver 124, a write address is not supplied to CAM word line decoder 112, and the addressed physical address is output from SRAM bit line sense amp 134 over communication path 136.

During an associative access, a virtual address is input to CAM bit line driver 120, and the input virtual address is simultaneously compared with all virtual addresses stored in CAM array 104. If the input virtual address matches a virtual address stored in CAM array 104 (e.g., in CAM cells 140(I,0-X)), then a high signal is generated on the appropriate match line (e.g., match line 152(I)). The high signal is detected by sense amp 172(I) which activates SRAM cells 156(I,0-Y) for communicating the stored physical address to SRAM bit line sense amp 134 and thereafter to the CPU over communication path 136.

Prior art devices using the technique employed by TLB 200 have two major drawbacks. First, SRAM array 108 must be dual port memory arrays which is more expensive than comparable single port memories. Second, a TLB implemented in this manner requires the use of two word line decoders which results in increased hardware costs and less available chip area.

SUMMARY OF THE INVENTION

The present invention solves the problems of the prior art by providing a fully associative TLB that supports associative access mode and non-associative read/write modes without necessitating the use of two word line decoders or dual port memories and without introducing an undesirable delay in the critical path of the associative access.

In one embodiment of a TLB according to the present invention, the match lines are used to select an address in a second memory for both the associative and the non-associative modes. More specifically, a first memory stores virtual memory addresses, a second memory stores physical memory addresses, a word line decoder decodes input virtual addresses for both the first and second memories, and a combining logic means, disposed outside the critical path of an associative access, combines the decoded address with a word line enable signal during a non-associative access and provides an output signal which is connected to a match line which activates a row of cells in the second memory.

The features and advantages of a translation lookaside buffer according to the present invention will be more clearly understood from the following description taken in conjunction with the accompanying drawings.

DESCRIPTION OF THE PREFERRED EMBODIMENT

Figure 3:
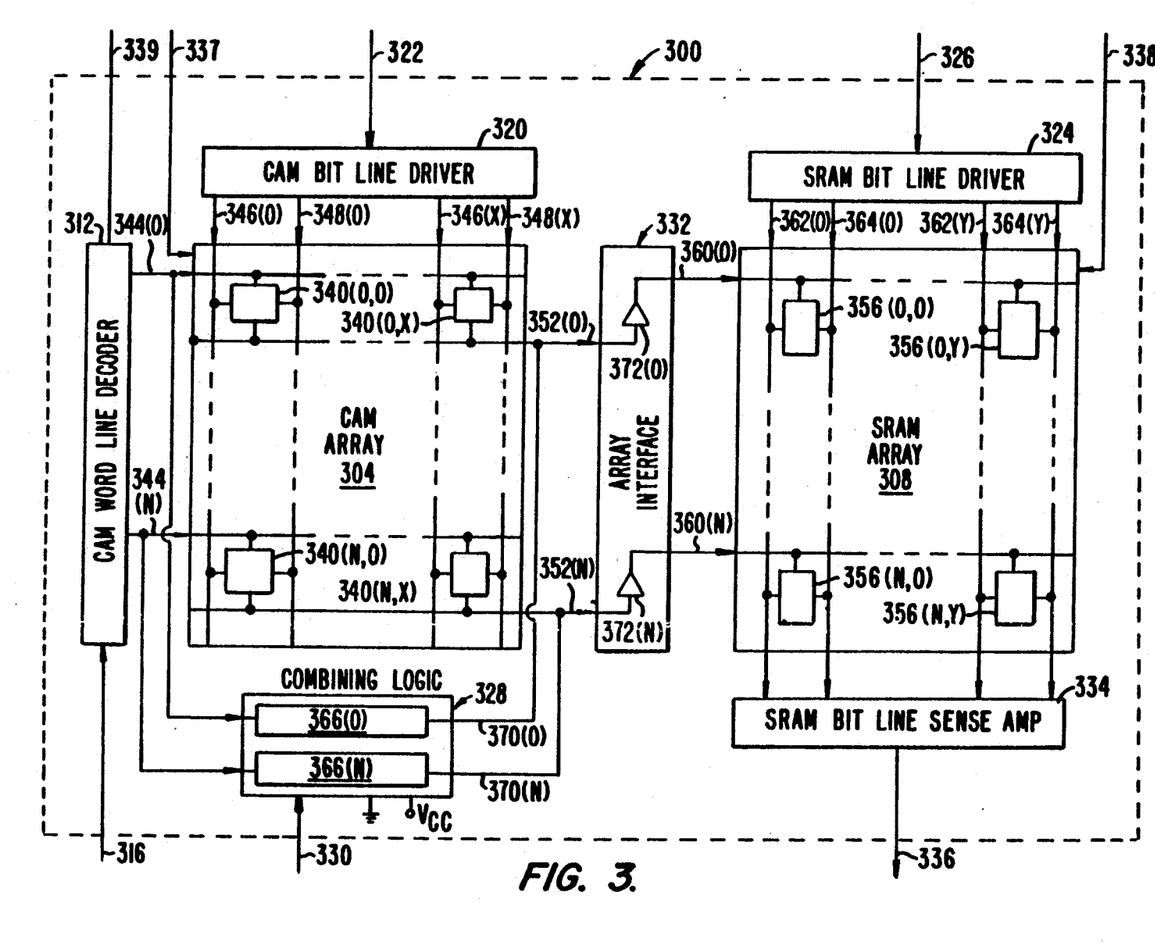
FIG. 3 is a block diagram showing one embodiment of a translation lookaside buffer according to the present invention.

FIG. 3 is a block diagram showing one embodiment of a fully associative translation lookaside buffer (TLB) 300 according to the present invention. TLB 300 comprises a content addressable memory (CAM) array 304 for storing a plurality of virtual addresses, a static random-access memory (SRAM) array 308 for storing a plurality of physical addresses corresponding to the virtual addresses stored in CAM array 304, a CAM word line decoder 312 for decoding a line address received from the CPU over a communication path 316, a CAM bit line driver 320 for receiving a virtual address from the CPU over a communication path 322, an SRAM bit line driver 324 for receiving a physical address from the CPU over a communication path 326, a combining logic unit 328 for combining signals from CAM word line decoder 312 and a communication path 330, an array interface 332 for accessing SRAM array 308 in response to signals from CAM array 304 and from combining logic unit 328, and an SRAM bit line sense amplifier 334 for providing a physical address stored in SRAM array 308 to the CPU over a communication path 336.

TLB 300 receives additional control signals from the CPU over communication paths 337, 338, and 339. Communication path 337 is coupled to an input terminal of CAM array 304 and carries a mode signal and a read/write signal. The mode signal indicates to CAM array 304 whether TLB 300 is operating in an associative mode or a non-associative mode, while the read/write signal indicates whether a read or write operation is to be performed when TLB 300 is operating in the non-associative mode. Communication path 338 carries a read/write signal, which indicates to SRAM array 308 whether a read or write operation is to be performed when TLB 300 is operating in the non-associative mode. Communication path 339 carries a mode signal, which indicates to CAM word line decoder 312 whether TLB 300 is operating in the associative mode or the non-associative mode.

CAM array 304 comprises a plurality of CAM cells 340(0,0) ... 340(N,X) having a comparator portion and arranged in N rows and X columns. Each row of CAM cells 340(0,0-X) ... 340(N,0-X) stores a single X-bit virtual address and is coupled to one of a plurality of CAM word lines 344(0) ... 344(N) from CAM word line decoder 312. Each column of CAM cells 340(0-N,0) ... 340(0-N,X) is coupled to a corresponding pair of a plurality of differential CAM bit lines 346(0) ... 346(X), 348(0) ... 348(X) from CAM bit line driver 320. CAM word lines 344(0) ... 344(N) and differential CAM bit lines 346(0) ... 346(X), 348(0) ... 348(X) activate the CAM cells 340(0,0) ... 340(N,X) to which they are attached. Each row of CAM cells 340(0,0-X) ... 340(N,0-X) is also connected to one of a plurality of match lines 352(0) ... 352(N) for indicating which row of CAM cells 340(0,0-X) ... 340(N,0-X) stores the virtual address which matches the virtual address input to CAM bit line driver 320.

Similarly, SRAM array 308 comprises a plurality of SRAM cells 356(0,0) ... 356(N,Y) arranged in N rows and Y columns. Each row of SRAM cells 356(0,0-Y) ... 356(N,0-Y) stores a single Y-bit physical address and is coupled to one of a plurality of SRAM word lines 360(0) ... 360(N) from array interface 332. Each column of SRAM cells 356(0-N,0) ... 356(0-N,Y) is coupled to a corresponding pair of a plurality of differential SRAM bit lines 362(0) ... 362(Y), 364(0) ... 364(Y) from SRAM bit line driver 324. SRAM word lines 360(0) ... 360(N) and differential SRAM bit lines 362(0) ... 362(Y), 364(0) ... 364(Y) activate the SRAM cells 356(0,0) ... 356(N,Y) to which they are attached. Differential SRAM bit lines 362(0) ... 362(Y), 364(0) ... 364(Y) are also coupled to SRAM bit line sense amplifier 334 for providing the contents of the selected row of SRAM cells to the CPU.

Combining logic unit 328 comprises a plurality of combining logic cells 366(0) ... 366(N). Combining logic cells 366(0) ... 366(N) receive the signals from CAM word lines 344(0) ... 344(N) and a word line enable signal from communication path 330 and provide a signal on corresponding combining logic output lines 370(0) ... 370(N). Combining logic output lines 370(0) ... 370(N) are coupled directly to match lines 352(0) ... 352(N) so that when a combining logic output line 370(I) is pulled low, a corresponding match line 352(I) is also pulled low.

Array interface 332 comprises a plurality of sense amplifiers 372(0) ... 372(N). Each sense amplifier 372(0) ... 372(N) has an input terminal coupled to a corresponding one of match lines 352(0) ... 352(N) and an output terminal coupled to a corresponding one of SRAM word lines 360(0) ... 360(N). Array interface 332 selects one of the rows of SRAM cells 356(0,0-Y) ... 356(N,0-Y) in response to match lines 352(0) ... 352(N).

The non-associative mode of operation of TLB 300 includes either a write access or a read access. During both the write non-associative mode and read non-associative mode, the comparator section of each CAM cell 340(0,0) ... 340(N,X), which is used in the associative mode, is deactivated by driving differential CAM bit lines 346(0) ... 346(X), 348(0) ... 348(X) low.

TLB 300 operates in non-associative write mode when the mode signal and read/write signals received over communication paths 337, 338, and 339 indicate non-associative mode and write mode, respectively. During a non-associative write access, a virtual address from the CPU is provided to CAM bit line driver 320 over communication path 322, a physical address from the CPU is provided to SRAM bit line driver 324 over communication path 326, and a write address is supplied from the CPU to CAM word line decoder 312 over communication path 316. CAM word line decoder 312 decodes the write address received over communication path 316 and generates a high signal on a single CAM word line 344(I) from the plurality of CAM word lines 344(0) ... 344(N) for activating addressed CAM cells 340(I,0-X). Combining logic unit 328 combines the signals on CAM word lines 344(0) ... 344(N) with a signal received over communication path 330 and generates a high signal on a single combining logic output line 370(I) from the plurality of combining logic output lines 370(0) . . . 370(N) in the manner discussed below. Combining logic output line 370(I) then generates a high signal on the corresponding match line 352(I). Array interface 332 detects the high signal on match line 352(I) and activates SRAM cells 356(I,0-Y) by generating a high signal on SRAM word line 360(I). The virtual and physical addresses are then written into CAM array 304 and SRAM array 308 at locations defined by the activated CAM cells 340(I,0-X) and SRAM cells 356(I,0-Y), respectively.

When the mode signal and read/write signals received over communication paths 337, 338, and 339 indicate non-associative mode and read mode, respectively, TLB 300 operates in the non-associative read mode. The non-associative read access operates in the same manner as the non-associative write mode, except addresses are not supplied to CAM bit line driver 320 or SRAM bit line driver 324, and the addressed physical address is output from SRAM bit line sense amp 334 over communication path 336.

TLB 300 operates in associative mode when the mode signal received over communication paths 337 and 339 indicates associative mode. During the associative mode of operation, a virtual address is input to CAM bit line driver 320 over communication path 322, and the input virtual address is simultaneously compared with all virtual addresses stored in CAM array 304.

To perform the comparison, the comparator portion of a CAM cell 340(I,J) compares the bit stored in CAM cell (I,J) with the bit of the input virtual address supplied on corresponding differential CAM bit lines 346(J), 348(J). If every CAM cell 340(I,0) . . . 340(I,X) in a row of CAM cells 340(I,0-X) stores a bit that matches the corresponding bit on differential CAM bit lines 346(0) . . . 346(X), 348(0) . . . 348(X), then the input virtual addresses matches a virtual address stored in CAM array 304 at row of CAM cells 340(I,0-X), and a high signal is generated on match line 352(I). The high signal is detected by sense amplifier 372(I) in array interface 332, which in turn activates SRAM cells 356(I,0-Y) for communicating the stored physical address to SRAM bit line sense amp 334 and thereafter to the CPU over communication path 336. If at least one CAM cell 340(I,J) contains a bit that does not match the corresponding bit input on differential CAM bit lines 346(J), 348(J), then match line 352(I) is discharged, and sense amplifier 372(I) does not activate SRAM cells 356(I,0-Y).

Figure 4:
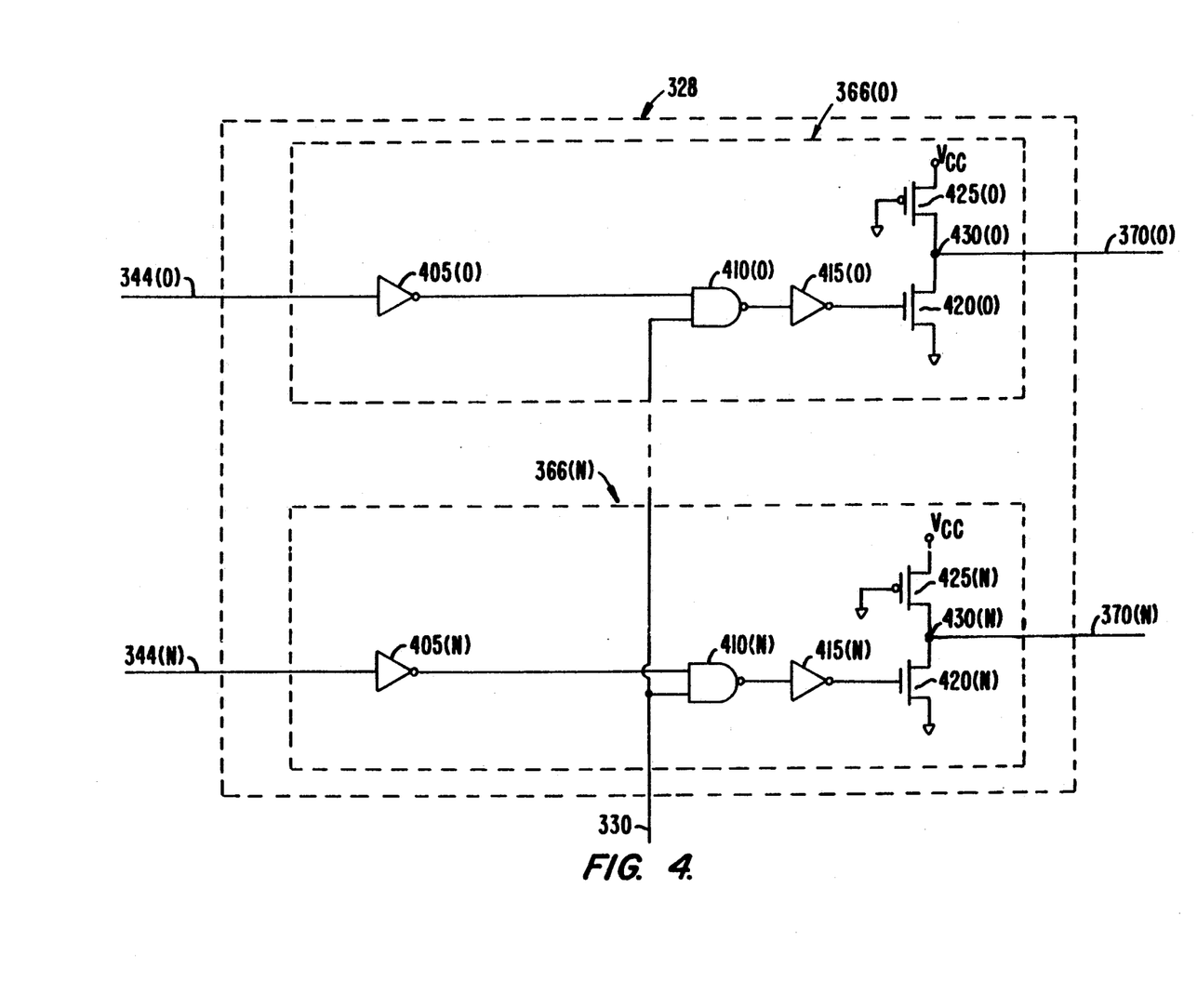
FIG. 4 is a schematic drawing of one embodiment of the combining logic unit shown in FIG. 3.

FIG. 4 is a schematic drawing of one embodiment of combining logic unit 328. For convenience, the same reference numerals used in FIG. 3 are used in FIG. 4 to refer to like elements. Combining logic unit 328 comprises a plurality of combining logic cells 366(0) . . . 366(N). Each combining logic cell is constructed identically, so only the construction of combining logic cell 366(0) shall be described.

Combining logic cell 366(0) comprises an inverter 405(0) having an input terminal coupled to CAM word line 344(0) and an output terminal coupled to a first input terminal of a NAND gate 410(0). A second input terminal of NAND gate 410(0) is coupled to communication path 330. An output of NAND gate 410(0) is coupled to an input terminal of an inverter 415(0), and an output terminal of inverter 415(0) is coupled to a gate terminal of NMOS transistor 420(0). A source terminal of NMOS transistor 420(0) is coupled to a ground potential, and a drain terminal of NMOS transistor 420(0) is coupled to a node 430(0) between combining logic output line 370(0) and a drain terminal of PMOS transistor 425(0). A gate terminal of PMOS transistor 425(0) is coupled to a ground potential, and a source terminal of PMOS transistor 425(0) is coupled to a voltage source $V_{cc}$.

In operation, a signal on CAM word line 344(0) is input to inverter 405(0) and gated with the CAM word line enable signal received over communication path 330 by NAND gate 410(0). The CAM word line enable signal is derived from the mode signal and is always low during the associative mode and high during the non-associative mode.

During an associative access, the low word line enable signal received over communication path 330 forces the output of NAND gate 410(0) to always be high and the output of inverter 415(0) to always be low. The low output of inverter 415(0) ensures that a low signal is present at the gate of NMOS transistor 420(0) which turns NMOS transistor 420(0) off. When NMOS transistor 420(0) is turned off, PMOS transistor 425(0) pulls combining logic output line 370(0) high. Thus, match line 352(0) is not affected by the signal on CAM word line 344(0) during an associative access.

In a non-associative access, the high word line enable signal received over communication path 330 allows the signal on CAM word line 344(0) to control combining logic output line 370(0). A low signal on CAM word line 344(0) indicates that corresponding CAM cells 340(0,0) . . . 340(0,X) and SRAM cells 356(0,0) . . . 356(0,Y) are not to be accessed. A low CAM word line 344(0) causes the output of inverter 405(0) to be high, which, when combined with the word line enable signal causes the output of NAND gate 410(0) to be low and the output of inverter 415(0) to be high. The high output of inverter 415(0) ensures that a high signal is present at the gate of NMOS transistor 420(0) which turns NMOS transistor 420(0) on. When NMOS transistor 420(0) is on, combining logic output line 370(0) is pulled low. This causes corresponding match line 352(0) to be pulled low, and match sense amplifier 372(0) will drive corresponding SRAM word line 360(0) low so that corresponding SRAM cells 356(0,0) . . . 356(0,Y) are not activated. NMOS transistor 420(0) is sized relative to CAM cells 340(0,0) . . . 340(0,X) so that it can pull match line 352(0) below the input level required by sense amplifier 372(0).

When the signal on CAM word line 344(0) is high during a non-associative access, which indicates that corresponding CAM cells 340(0,0) . . . 340(0,X) and SRAM cells 356(0,0) . . . 356(0,Y) are to be accessed, the output of inverter 405(0) is low. The low output of inverter 405(0) causes the output of NAND gate 410(0) to be high and the output of inverter 415(0) to be low. The low output of inverter 415(0) ensures that a low signal is present at the gate of NMOS transistor 420(0) which turns NMOS transistor 420(0) off. When NMOS transistor 420(0) is turned off, PMOS transistor 425(0) pulls combining logic output line 370(0) high, which in turn, pulls match line 352(0) high. Match sense amplifier 372(0) then drives corresponding SRAM word line 360(0) high to activate corresponding SRAM cells 356(0,0) . . . 356(0,Y).

Those of skill in the art will recognize that a dynamic approach to charging and discharging combining logic output line 370(0), which involves coupling the gate terminal of transistor 425(0) to a signal that turns transistor 425(0) on to charge match line 352(0) before an associative or non-associative access occurs and turns transistor 425(0) off during the time period in which CAM cells 340(0,0) . . . 340(0,X) are being associatively or non-associatively accessed, would also work with this new decoding scheme.

Figure 5:
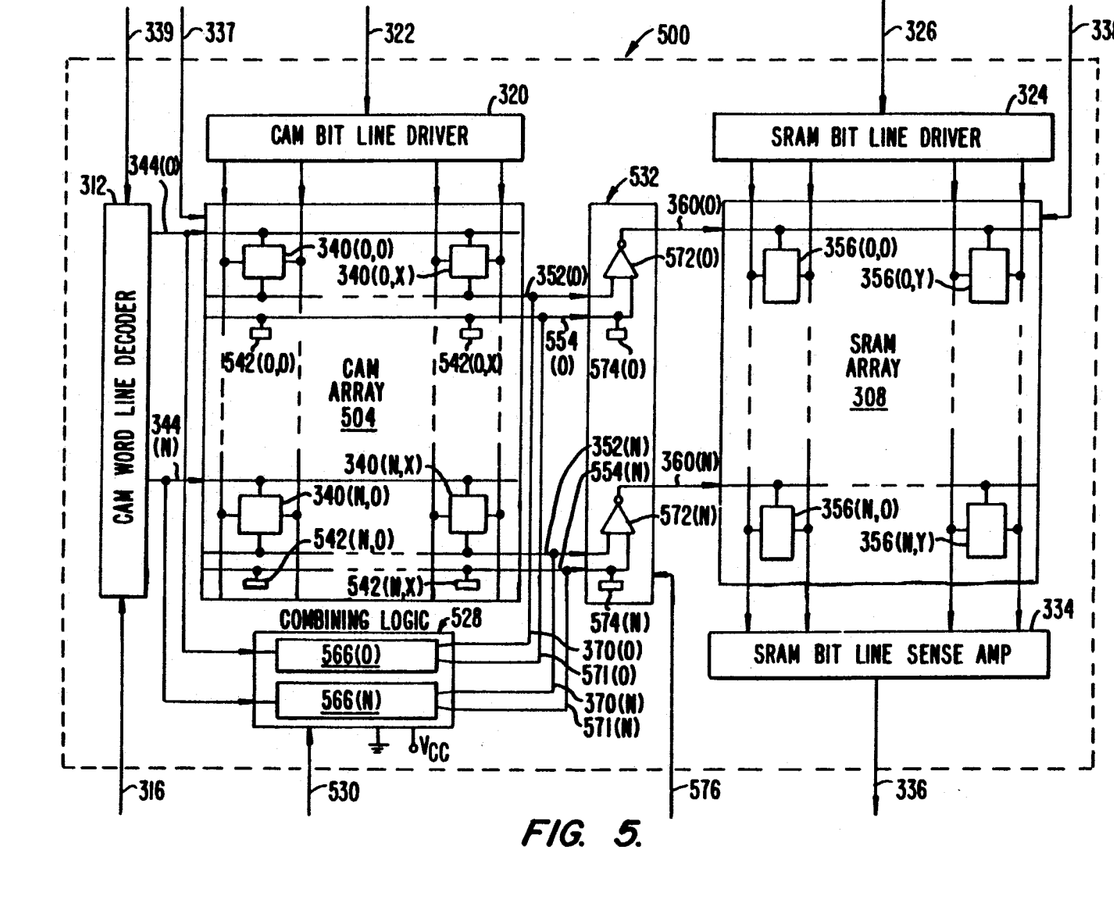
FIG. 5 is a block diagram of a second embodiment of a translation lookaside buffer according to the present invention that uses a differential operation to detect the assertion of a match line.

FIG. 5 is a block diagram of a second embodiment of a translation lookaside buffer 500 according to the present invention. For convenience, the same reference numerals used in FIG. 3 are used in FIG. 5 to refer to identical elements. Furthermore, the construction and operation of TLB 500 is identical to TLB 300 except for CAM array 504, combining logic unit 528, and array interface 532. Therefore, only the structure and operation of these structures is described below.

CAM array 504 is identical to CAM array 304 except that for every CAM cell 340(0,0) . . . 340(N,X) there is a corresponding capacitively coupled NMOS transistor 542(0,0) . . . 542(N,X). Each row of NMOS transistors 542(0,0-X) . . . 542(N,0-X) is coupled to one of a plurality of low match lines 554(0) . . . 554(N), and each NMOS transistor is sized so that it adds an amount of capacitance to the low match line it is coupled to that is equivalent to the capacitance each CAM cell 340(0,0) . . . 340(N,X) adds to the match line 352(0) . . . 352(N) it is coupled to. The capacitance added by NMOS transistors 542(0,0) . . . 542(N,X) is necessary to ensure that when CAM array 504 is associatively accessed, the timing of match lines 352(0) . . . 352(N) matches the timing of low match lines 554(0) . . . 554(N).

Combining logic unit 528 comprises a plurality of combining logic cells 566(0) . . . 566(N). Combining logic cells 566(0) . . . 566(N) combine input signals received from CAM word lines 344(0) . . . 344(N) with a word line enable signal received on communication path 530 and provide output signals on corresponding combining logic output lines 370(0) . . . 370(N) and combining logic low output lines 571(0) . . . 571(N). Combining logic output lines 370(0) . . . 370(N) are coupled directly to match lines 352(0) . . . 352(N) so that when a combining logic output line 370(I) is pulled high, a corresponding match line 352(I) is also pulled high. Combining logic low output lines 571(0) . . . 571(N) are coupled directly to low match lines 554(0) . . . 554(N) so that when a combining logic low output line 570(I) is pulled low, a corresponding low match line 554(I) is also pulled low.

Array interface 532 comprises a plurality of differential sense amplifiers 572(0) . . . 572(N). Each differential sense amplifier 572(0) . . . 572(N) has a first input terminal coupled to a corresponding one of match lines 352(0) . . . 352(N), a second input terminal coupled to a corresponding one of low match lines 554(0) . . . 554(N), and an output terminal coupled to a corresponding one of SRAM word lines 360(0) . . . 360(N). Additionally, array interface 532 comprises a plurality of pulldown transistors 574(0) . . . 574(N) coupled to low match lines 544(0) . . . 544(N), and an input terminal for receiving a signal over communication path 576. Array interface 532 activates one of the rows of SRAM cells 356(0,0-Y) . . . 356(N,0-Y) in response to signals from match lines 352(0) . . . 352(N) and low match lines 554(0) . . . 554(N).

During the associative mode, the comparator portion of a CAM cell 340(I,J) compares the bit stored in CAM cell 340(I,J) with the bit of the input virtual address supplied on corresponding differential CAM bit lines 346(J), 348(J). If the bit stored in CAM cell 340(I,J) matches the corresponding bit input on differential CAM bit lines 346(J), 348(J), a match transistor in the comparator portion of CAM cell 340(I,J) is not turned on. Thus, CAM cell 340(I,J) does not discharge match line 352(I). If every CAM cell 340(I,0) . . . 340(I,X) in a row of CAM cells 340(I,0-X) stores a bit that matches the corresponding bit on differential CAM bit lines 346(0) . . . 346(X), 348(0) . . . 348(X), then the input virtual addresses matches a virtual address stored in CAM array 304 at row of CAM cells 340(I,0-X), and match line 352(I) remains high.

If at least one CAM cell 340(I,J) contains a bit that does not match the corresponding bit input on differential CAM bit lines 346(J), 348(J), then match line 352(I) is discharged by allowing current to flow through the match transistor in CAM cell 340(I,J). The rate at which match line 352(I) is discharged depends on how many CAM cells in the row of CAM cells 340(I,0-X) store bits that do not match the corresponding bits input on differential CAM bit lines 346(0) . . . 346(X), 348(0) . . . 348(X)—the slowest rate being when a single CAM cell 340(I,J) does not match.

At the exact same time that match lines 352(0) . . . 352(N) are discharged, a high signal received over communication path 576 activates pulldown transistors 574(0) . . . 574(N) to discharge low match lines 542(0) . . . 542(N). Pulldown transistors 574(0) . . . 574(N) are sized so that they always discharge low match line lines 554(0) . . . 554(N) at a rate half as fast as the rate a single mismatched CAM cell 340(I,J) discharges match line 352(I). The preferred embodiment of the present invention ensures that the discharge ratio is 2:1 (two-to-one) by sizing each match transistor in CAM cells 340(0,0) . . . 340(N,X) and the pulldown transistors 574(0) . . . 574(N) identically, and then using two transistors coupled together at their gates, sources, and drains to function as a single match transistor in each of CAM cells 340(0,0) . . . 340(N,X).

Differential sense amplifier 572(I) compares the voltage level on match line 352(I) to the voltage level on low match line 554(I). If all the CAM cells 340(I,0) . . . 340(I,X) store matching bits, then match line 352(I), which remains high, will be higher than low match line 554(I). Differential sense amplifier 572(I) recognizes this as a match and activates the row of SRAM cells 356(I,0) . . . 356(I,Y) for communicating the stored physical address to SRAM bit line sense amplifier 334 and thereafter to the CPU over communication path 336. If at least one CAM cell does not match, then match line 352(I) discharges at a rate faster than low match line 554(I) discharges, and differential sense amplifier recognizes that a match has not occurred and does not activate row of SRAM cells 356(I,0) . . . 356(I,Y). The use of differential sense amplifiers 572(0) . . . 572(N) allows the detection of voltage swings as low as 50 millivolts, which greatly speeds up the operation of TLB 500.

In a non-associative access, pulldown transistors 574(0) . . . 574(N) are deactivated by driving the signal on communication path 576 low, and CAM cells 340(0,0) . . . 340(N,X) are deactivated by driving differential CAM bit lines 346(0) . . . 346(X), 348(0) . . . 348(X) low.

Figure 6:
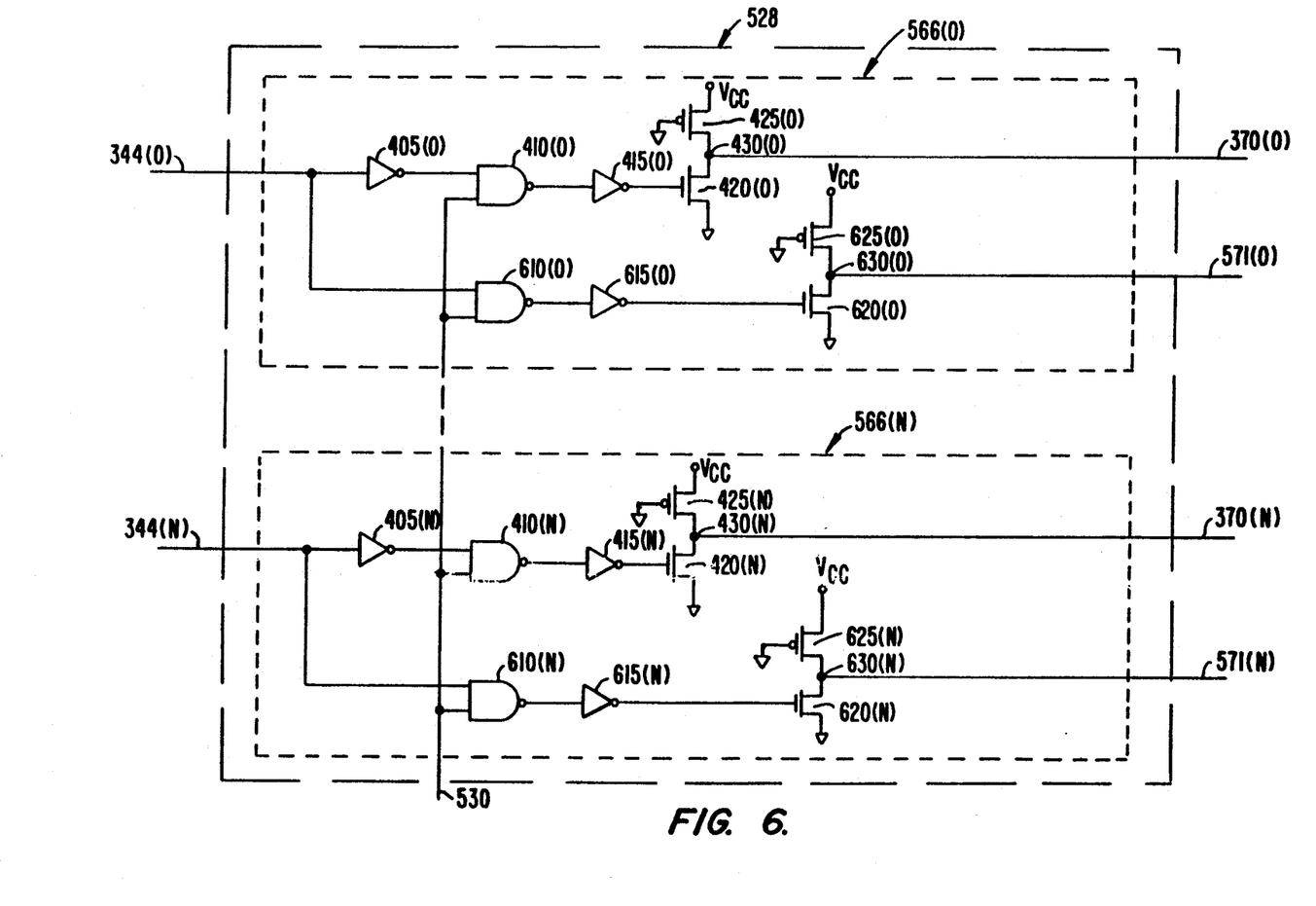
FIG. 6 is a schematic drawing of one embodiment of the combining logic unit shown in FIG. 5.

FIG. 6 is a schematic drawing of one embodiment of combining logic unit 528 shown in FIG. 5. The operation of combining logic unit 528 is very similar to the operation of combining logic unit 328 shown in FIG. 4, the only difference being the addition of a combing logic low output lines 571(0) . . . 571(N) and associated logic. For convenience, the same reference numerals used in FIGS. 4 and 5 are used in FIG. 6 to refer to like elements. Each combining logic cell is constructed identically, so only the construction of combining logic cell 566(0) shall be described.

Combining logic cell 566(0) comprises an inverter 405(0) having an input terminal coupled to CAM word line 344(0) and an output terminal coupled to a first input terminal of a NAND gate 410(0). A second input terminal of NAND gate 410(0) is coupled to communication path 530. An output terminal of NAND gate 410(0) is coupled to an input terminal of an inverter 415(0), and an output terminal of inverter 415(0) is coupled to a gate terminal of NMOS transistor 420(0). A source terminal of NMOS transistor 420(0) is coupled to a ground potential, and a drain terminal of NMOS transistor 420(0) is coupled to a node 430(0) between combining logic output line 370(0) and a drain terminal of PMOS transistor 425(0). A gate terminal of PMOS transistor 425(0) is coupled to a ground potential, and a source terminal of PMOS transistor 425(0) is coupled to a voltage source $V_{cc}$.

CAM word line 344(0) is also coupled to a first input terminal of a NAND gate 610. A second input terminal of NAND gate 610(0) is coupled to communication path 530. An output terminal of NAND gate 610(0) is coupled to an input terminal of an inverter 615(0), and an output terminal of inverter 615(0) is coupled to a gate terminal of NMOS transistor 620(0). A source terminal of NMOS transistor 620(0) is coupled to a ground potential, and a drain terminal of NMOS transistor 620(0) is coupled to a node 630(0) between combining logic low output line 571(0) and a drain terminal of PMOS transistor 625(0). A gate terminal of PMOS transistor 625(0) is coupled to a ground potential, and a source terminal of PMOS transistor 625(0) is coupled to a voltage source $V_{cc}$.

The operation of combining logic cell 566(0) is as follows. During an associative access, a low word line enable signal received over communication path 530 forces the output of NAND gates 410(0) and 610(0) to always be high and the output of inverters 415(0) and 615(0) to always be low. The low output of inverters 415(0) and 615(0) ensures that low signals are present at the gates of NMOS transistors 420(0) and 620(0), respectively, which turn NMOS transistors 420(0) and 620(0) off. When NMOS transistors 420(0) and 620(0) are turned off, PMOS transistors 425(0) and 625(0) pull combining logic output line 370(0) and combining logic low output line 571(0) high. Thus, match line 352(0) and low match line 544(0) are not affected by the signal on CAM word line 344(0) during an associative access.

During a non-associative access, a high word line enable signal received over communication path 530 allows the signal on CAM word line 344(0) to control combining logic output line 370(0) and combining logic low output line 571(0). A low signal on CAM word line 344(0) indicates that corresponding CAM cells 340(0,0) . . . 340(0,X) and SRAM cells 356(0,0) . . . 356(0,Y) are not to be accessed. A low CAM word line 344(0) causes the output of inverter 405(0) to be high, which, when combined with the word line enable signal, causes the output of NAND gate 410(0) to be low and the output of inverter 415(0) to be high. The high output of inverter 415(0) ensures that a high signal is present at the gate of NMOS transistor 420(0) which turns NMOS transistor 420(0) on. When NMOS transistor 420(0) is on, combining logic output line 370(0) is pulled low which pulls match line 352(0) low.

Additionally, the output of NAND gate 610(0) is high and the output of inverter 615(0) is low. The low output of inverter 615(0) ensures that a low signal is present at the gate of NMOS transistor 620(0) which turns NMOS transistor 620(0) off. When NMOS transistor 620(0) is off, PMOS transistor 625(0) pulls combining logic low output line 571(0) high, which in turn, pulls low match line 554(0) high. Differential sense amplifier 572(0) then detects a logical zero (match line (352(0) at a lower voltage than low match line 544(0)) and does not activate SRAM cells 356(0,0) . . . 356(0,Y).

When the signal on CAM word line 344(0) is high during a non-associative access, which indicates that corresponding CAM cells 340(0,0) . . . 340(0,X) and SRAM cells 356(0,0) . . . 356(0,Y) are to be accessed, the output of inverter 405(0) is low. The low output of inverter 405(0) causes the output of NAND gate 410(0) to be high and the output of inverter 415(0) to be low. The low output of inverter 415(0) ensures that a low signal is present at the gate of NMOS transistor 420(0) which turns NMOS transistor 420(0) off. When NMOS transistor 420(0) is turned off, PMOS transistor 425(0) pulls combining logic output line 370(0) high, which in turn, pulls match line 352(0) high.

Additionally, the output of NAND gate 610(0) is low and the output of inverter 615(0) is high. The high output of inverter 615(0) ensures that a high signal is present at the gate of NMOS transistor 620(0) turning the transistor on. When NMOS transistor 620(0) is on, combining logic low output line 571(0) is pulled low which pulls low match line 554(0) low. Differential sense amplifier 572(0) then detects a logical one (match line (352(0) at a higher voltage than low match line 554(0)) and activates SRAM cells 356(0,0) . . . 356(0,Y).

Having fully described the preferred embodiments of the present invention, many other equivalent or alternative methods of implementing the improved translation lookaside buffer will be apparent to those skilled in the art. These equivalents and alternatives are intended to be included within the scope of the present invention.

What is claimed is:

1. A memory apparatus comprising:
    a memory having a plurality of rows of memory cells for storing a corresponding plurality of data words;
    word input means, coupled to said memory, for providing an input word to said memory;
    a plurality of match signal lines, each match signal line being coupled to a corresponding one of said plurality of rows of memory cells;
    comparing means, coupled to said plurality of rows of memory cells, to said word input means, and to said plurality of match signal lines, for comparing said input word to said plurality of data words and for providing a match signal on a selected match signal line when a data word stored in a row of memory cells corresponding to said selected match signal line matches said input word;
    a plurality of row activating lines, each row activating line being coupled to a corresponding one of said plurality of rows of memory cells;
    row activating means, coupled to said plurality of row activating lines, for providing row activating signals on said plurality of row activating lines for selectively activating said plurality of rows of memory cells; and match signal generating means, coupled in parallel with said memory to said plurality of row activating lines and to said plurality of match signal lines, for selectively generating match signals on said plurality of match signal lines in response to said row activating signals.

2. The memory apparatus of claim 1 wherein said match signal generating means comprises a plurality of match signal generating cells, each match signal generating cell being coupled to a corresponding one of said plurality of row activating lines and to a corresponding one of said plurality of match signal lines.

3. The memory apparatus of claim 2 wherein each of said plurality of match signal generating cells comprises a combining means for combining one of said row activating signals with a mode select signal.

4. The memory apparatus of claim 3 wherein said combining means comprises a NAND gate with a first input terminal coupled to one of said plurality of row activating lines, a second input terminal coupled to a mode select line, which carries said mode select signal, and an output terminal coupled to one of said plurality of match signal lines.

5. The memory apparatus of claim 1 further comprising a mode selecting means, coupled to said memory and to said row activating means, for selecting a mode for the memory apparatus to operate in from an associative mode, a non-associative write mode, and a non-associative read mode.

6. The memory apparatus of claim 1 wherein said memory comprises a content addressable memory (CAM) array.

7. A memory apparatus comprising:
a virtual memory having a plurality of rows of memory cells for storing a corresponding plurality of virtual addresses;
virtual address input means, coupled to said virtual memory, for providing an input virtual address to said virtual memory;
a plurality of match signal lines, each match signal line being coupled to a corresponding one of said plurality of rows of virtual memory cells;
comparing means, coupled to said plurality of rows of virtual memory cells, to said virtual address input means, and to said plurality of match signal lines, for comparing said input virtual address to said plurality of stored virtual addresses and for providing a match signal on a selected match signal line when a stored virtual address in a row of virtual memory cells corresponding to said selected match signal line matches said input virtual address;
a plurality of virtual address activating lines, each virtual address activating line being coupled to a corresponding one of said plurality of rows of virtual memory cells;
address activating means, coupled to said plurality of virtual address activating lines, for providing virtual address activating signals on said plurality of virtual address activating lines for selectively activating said plurality of rows of virtual memory cells;
match signal generating means, coupled in parallel with said virtual memory to said plurality of virtual address activating lines and to said plurality of match signal lines, for selectively generating match signals on said plurality of match signal lines in response to said virtual address activating signals;
a real memory having a plurality of rows of memory cells for storing a corresponding plurality of real addresses;
a plurality of real address activating lines, each a real address activating line being coupled to a corresponding one of said plurality of rows of real memory cells;
detecting means, coupled to said plurality of match signal lines and to said plurality of real address activating lines, for detecting when a match signal is present on one of said plurality of match signal lines and providing a real address activating signal on a corresponding one of said plurality of real address activating lines for selectively activating said plurality of rows of real memory cells.

8. The memory apparatus of claim 7 wherein said detecting means comprises a plurality of match sense amplifiers, each match sense amplifier being coupled at an input terminal to one of said plurality of match signal lines and at an output terminal to one of said plurality of real address activating lines.

9. The memory apparatus of claim 7 wherein said match signal generating means comprises a plurality of match signal generating cells, each match signal generating cell being coupled to a corresponding one of said plurality of row activating lines and to a corresponding one of said plurality of match signal lines.

10. The memory apparatus of claim 9 wherein each of said plurality of match signal generating cells comprises a combining means for combining one of said virtual address activating signals with a mode select signal.

11. The memory apparatus of claim 10 wherein said combining means comprises a NAND gate with a first input terminal coupled to one of said plurality of row activating lines, a second input terminal coupled to a mode select line, which carries said mode select signal, and an output terminal coupled to one of said plurality of match signal lines.

12. The memory apparatus of claim 7 further comprising:
real address input means, coupled to said real memory, for providing an input real address to said real memory;
real address output means, coupled to said real memory, for providing an output real address from said real memory;
mode selecting means, coupled to said address activating means, to said virtual memory, to said match signal generating means, and to said real memory, for selecting a mode for the memory apparatus to operate in from an associative mode, a non-associative write mode, and a non-associative read mode,
wherein when said associative mode is selected, a selected real address is output from said activated row of real memory cells in said real memory through said real address output means;
wherein when said non-associative write mode is selected, said input virtual address is stored in said activated row of said virtual memory cells in said virtual memory, and said input real address is stored in said activated row of real memory cells in said real memory; and
wherein when said non-associative read mode is selected, a selected real address is output from said activated row of real memory cells in said real memory through said real address output means.

13. The memory apparatus of claim 7 wherein said virtual memory comprises a content addressable memory (CAM) array.

14. A memory apparatus comprising:
   a memory having a plurality of rows of memory cells for storing a corresponding plurality of data words;
   word input means, coupled to said memory, for providing an input word to said memory;
   a plurality of differential match signal lines, each differential match signal line being coupled to a corresponding one of said plurality of rows of memory cells;
   comparing means, coupled to said plurality of rows of memory cells, to said word input means, and to said plurality of differential match signal lines, for comparing said input word to said plurality of data words and for providing a match signal on a selected differential match signal line when a data word stored in a row of memory cells corresponding to said selected differential match signal line matches said input word;
   a plurality of row activating lines, each row activating line being coupled to a corresponding one of said plurality of rows of memory cells;
   row activating means, coupled to said plurality of row activating lines, for providing row activating signals on said plurality of row activating lines for selectively activating said plurality of rows of memory cells; and
   match signal generating means, coupled in parallel with said memory to said plurality of row activating lines and to said plurality of differential match signal lines, for selectively generating match signals on said plurality of differential match signal lines in response to said row activating signals.

15. The memory apparatus of claim 14 further comprising:
   a plurality of second memory row activating lines; and
   a detecting means for detecting when a match signal is present on one of said plurality of differential match signal lines and providing a second memory row activating signal on one of said plurality of second memory row activating lines;
   wherein said plurality of differential match signal lines comprises a plurality of first match signal lines, coupled to said detecting means, and a corresponding plurality of second match signal lines, coupled to said detecting means;
   wherein said comparing means comprises a plurality of rows of comparing units, each row of comparing units being coupled to a corresponding plurality of rows of memory cells, to said word input means, and to said plurality of first match signal lines, and a corresponding plurality of rows of capacitance adding units, each row of capacitance adding units being coupled to said plurality of second match signal lines, for adding capacitance to said second match signal lines; and
   wherein said match signal generating means comprises a plurality of match signal generating cells, each match signal generating cell being coupled at a first input terminal to a corresponding one of said plurality of row activating lines, at a second input terminal to a mode select line, at a first output terminal to a corresponding first match signal line, and at a second output terminal to a corresponding second match signal line.

16. The memory apparatus of claim 15 wherein each capacitance adding unit comprises a capacitively coupled NMOS transistors.

17. The memory apparatus of claim 15 wherein each of said plurality of match signal generating cells comprises a combining means for combining one of said row activating signals with a mode select signal.

18. The memory apparatus of claim 17 wherein said combining means comprises a first NAND gate with a first input terminal coupled to one of said plurality of row activating lines, a second input terminal coupled to said mode select line, and an output terminal coupled to one of said plurality of first match signal lines; and a second NAND gate with a first input terminal coupled to an output terminal of an inverter with an input terminal coupled to one of said plurality of row activating lines, a second input terminal coupled to said mode select line, and an output terminal coupled to one of said plurality of second match signal lines.

19. The memory apparatus of claim 15 wherein said detecting means comprises:
   a plurality of differential sense amplifiers, each differential sense amplifier having a first input terminal coupled to a corresponding one of said plurality of first match signal lines, a second input terminal coupled to a corresponding one of said plurality of second match signal lines, and an output terminal coupled to a corresponding one of said plurality of second memory row activating lines; and
   a plurality of discharging means, each discharging means coupled to a corresponding one of said plurality of second match signal lines, for slowly discharging one of said plurality of second match signal lines.

20. The memory apparatus of claim 15 wherein said memory comprises a content addressable memory (CAM) array.

* * * * *